United States Patent [19]
Naruse

[11] Patent Number: 5,476,813
[45] Date of Patent: Dec. 19, 1995

[54] METHOD OF MANUFACTURING A BONDED SEMICONDUCTOR SUBSTRATE AND A DIELECTRIC ISOLATED BIPOLAR TRANSISTOR

[75] Inventor: Hiroshi Naruse, Yokohama, Japan

[73] Assignee: Kabushiki Kaisha Toshiba, Kawasaki, Japan

[21] Appl. No.: 340,361

[22] Filed: Nov. 14, 1994

[30] Foreign Application Priority Data

Nov. 15, 1993 [JP] Japan .................................. 5-284780

[51] Int. Cl.$^6$ .................................................. H01L 21/20
[52] U.S. Cl. .......................... 437/132; 437/31; 437/62; 437/247; 437/947; 437/33; 148/DIG. 12; 148/DIG. 51; 148/DIG. 58; 148/DIG. 150; 156/630.1; 156/662.1; 257/586
[58] Field of Search .................... 148/DIG. 12, DIG. 51, 148/DIG. 58, DIG. 150; 437/62, 947, 132, 247, 228, 31; 156/630, 662; 257/586

[56] References Cited

U.S. PATENT DOCUMENTS

| | | | |
|---|---|---|---|
| 4,601,779 | 7/1986 | Abernathey et al. | 156/630 |
| 4,771,016 | 9/1988 | Bajor et al. | 148/DIG. 150 |
| 4,897,362 | 1/1990 | Delgado et al. | 437/31 |
| 5,013,681 | 5/1991 | Godbey et al. | 437/86 |
| 5,234,535 | 8/1993 | Beyer et al. | 437/62 |
| 5,277,748 | 1/1994 | Sakaguchi et al. | 437/62 |
| 5,310,451 | 5/1994 | Tejwani et al. | 437/62 |
| 5,324,678 | 6/1994 | Kusunoki | 437/62 |
| 5,340,435 | 8/1994 | Ito et al. | 437/974 |
| 5,344,524 | 9/1994 | Sharma et al. | 437/974 |
| 5,366,923 | 11/1994 | Beyer et al. | 437/974 |
| 5,366,924 | 11/1994 | Easter et al. | 437/974 |
| 5,374,581 | 12/1994 | Ichikawa et al. | 437/974 |

Primary Examiner—Olik Chaudhuri
Assistant Examiner—Long Pham
Attorney, Agent, or Firm—Finnegan, Henderson, Farabow, Garrett & Dunner

[57] ABSTRACT

In a method of manufacturing a bonded semiconductor substrate, a SiGe mixed crystal layer, a silicon layer containing N-type impurities, a SiGe mixed crystal layer containing N-type impurities of high concentration, and a silicon layer containing N-type impurities of high concentration are formed in this order on a top surface of a silicon substrate by an epitaxial growth process to form a first semiconductor substrate. A silicon oxide film is formed on a surface of a silicon substrate to form a second semiconductor substrate. The first and second semiconductor substrates are bonded to each other by heat treatment, with their top surfaces contacting each other. The first semiconductor substrate is etched from the back surface thereof until the SiGe mixed crystal layer is exposed, and the SiGe mixed crystal layer is etched until the silicon layer containing N-type impurities is exposed. This method prevents the thickness of the element forming layer from varying.

24 Claims, 5 Drawing Sheets

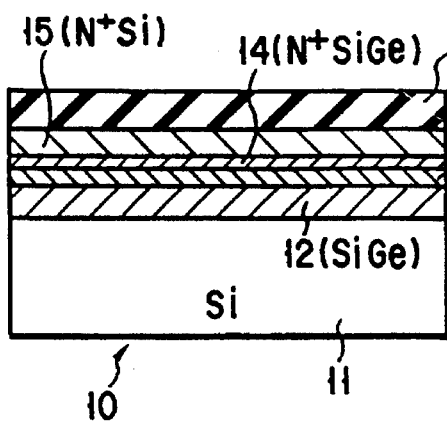
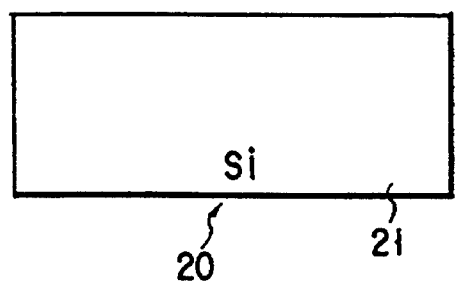
FIG. 2A   FIG. 2B
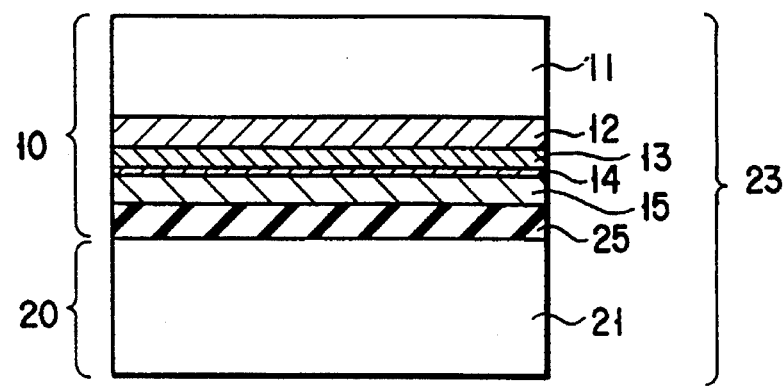
FIG. 2C
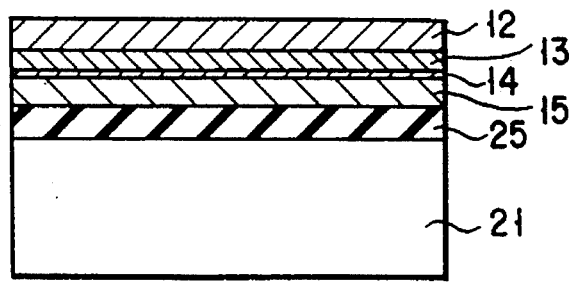
FIG. 2D
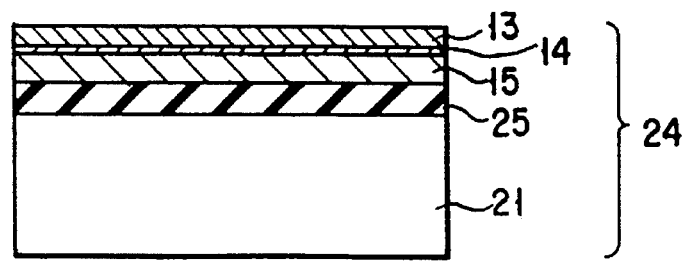
FIG. 2E

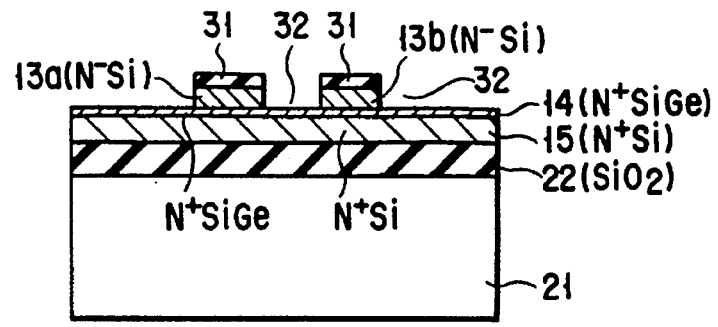
F I G. 4A
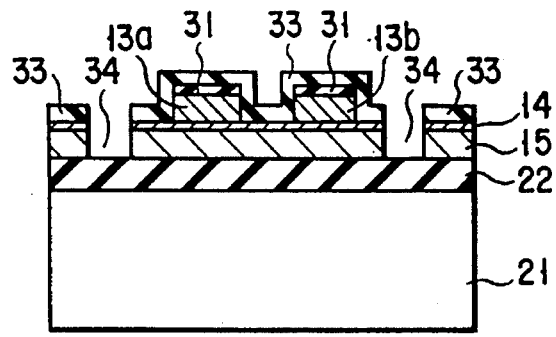
F I G. 4B
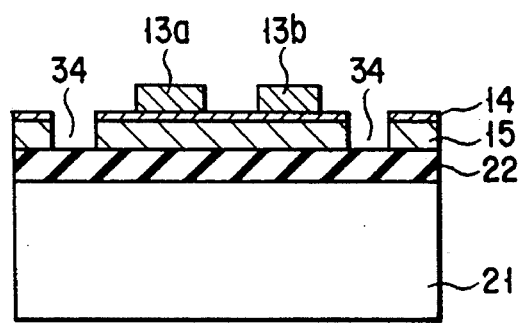
F I G. 4C
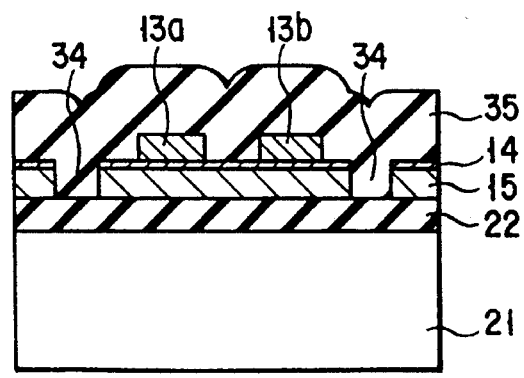
F I G. 4D

METHOD OF MANUFACTURING A BONDED SEMICONDUCTOR SUBSTRATE AND A DIELECTRIC ISOLATED BIPOLAR TRANSISTOR

BACKGROUND OF THE INVENTION

1. Field of the Invention

The present invention relates to a method of manufacturing a bonded semiconductor substrate and a dielectric isolated bipolar transistor and, more specifically, to a method of manufacturing a bonded semiconductor substrate using a substrate bonding technique and a method of forming a dielectric isolated high-speed bipolar transistor on the bonded semi-conductor substrate.

2. Description of the Related Art

A dielectric isolated bipolar device having an SOI (silicon on insulator) structure has recently been proposed as a means for increasing the operation speed of a silicon bipolar transistor in order to reduce a junction capacitance between devices and between a collector and a substrate.

A bonded semiconductor substrate having the SOI structure is manufactured by the following one conventional method. A silicon oxide film is formed on the surface of one of two semiconductor wafers or each surface of the two wafers, and the wafers are bonded by high-temperature heat treatment with the surfaces in contact with each other. After that, one of the bonded wafers is polished from the backside thereof and then etched.

The above method however has a drawback wherein the thickness of an SOI film of the bonded semiconductor wafers varies with the polishing and etching. The variation in thickness varies the depth of a collector layer of the finished transistor, which makes it difficult to control the resistance of the collector layer. The reduction in collector resistance is important for the high-speed operation of a bipolar transistor. Though it is advantageous to use a thin epitaxial growth layer to decrease the collector resistance, a variation in collector resistance is fatal to uniform formation of high-speed devices.

A method of forming the above dielectric isolated bipolar transistor on the conventional bonded semiconductor substrate has the drawback wherein the depth of the collector layer are varied with the uneven thickness of the SOI film, thereby making it difficult to control the collector resistance and to uniformly form the high-speed devices.

SUMMARY OF THE INVENTION

The present invention has been developed in order to eliminate the above drawback and an object thereof is to provide a method of manufacturing a bonded semiconductor substrate which prevents an element forming layer of the substrate from varying in thickness.

Another object of the present invention is to provide a method of manufacturing a dielectric isolated bipolar transistor capable of achieving a dielectric isolated high-speed bipolar structure with high reproducibility, using the above bonded semiconductor substrate.

According to an aspect of the present invention, there is provided a method of manufacturing a bonded semiconductor substrate, comprising the steps of:

providing a first semiconductor substrate of a silicon substrate, having a top surface and a back surface, the top surface having thereon a SiGe mixed crystal layer, a silicon layer containing N-type impurities, a SiGe mixed crystal layer containing N-type impurities of high concentration, and a silicon layer containing N-type impurities of high concentration, which are formed in order by an epitaxially growth process;

providing a second semiconductor substrate of a silicon substrate, having a top surface;

providing a silicon oxide film on at least one of the top surface of the first semiconductor substrate and the surface of the second semiconductor substrate;

contacting the top surfaces of the first and second semiconductor substrates, at least one of which being provided thereon with the silicon oxide film, and bonding the first and second semiconductor substrates to each other by heat treatment;

etching the first semiconductor substrate from the back surface until the SiGe mixed crystal layer is exposed; and etching the SiGe mixed crystal layer until the silicon layer containing N-type impurities is exposed.

According to another aspect of the present invention, there is provided a method of manufacturing a dielectric isolated bipolar transistor, comprising the steps of:

providing a first semiconductor substrate of a silicon substrate, having a top surface and a back surface, the top surface having thereon a SiGe mixed crystal layer, a silicon layer containing N-type impurities, a SiGe mixed crystal layer containing N-type impurities of high concentration, and a silicon layer containing N-type impurities of high concentration, which are formed in order by an epitaxially growth process;

providing a second semiconductor substrate of a silicon substrate, having a top surface;

providing a silicon oxide film on at least one of the top surface of the first semiconductor substrate and the surface of the second semiconductor substrate;

contacting the top surfaces of the first and second semiconductor substrates, at least one of which being provided thereon with the silicon oxide film, and bonding the first and second semiconductor substrates to each other by high-temperature heat treatment;

etching the first semiconductor substrate from the back surface until the SiGe mixed crystal layer is exposed;

etching the SiGe mixed crystal layer until the silicon layer containing N-type impurities is exposed;

providing first insulation films on portions of the silicon layer containing N-type impurities, the portions serving as a base/emitter and a collector;

etching the silicon layer containing N-type impurities, using the first insulation films as masks and using the SiGe mixed crystal layer containing N-type impurities of high concentration as an etching stopper;

providing a second insulation film on a region other than an element isolation region;

etching the SiGe mixed crystal layer containing N-type impurities of high concentration and the silicon layer containing N-type impurities of high concentration, using the second insulation film as a mask; and removing the first and second insulation films, providing a third insulation film over the first semiconductor substrate, and etching the third insulation film until the regions serving as the base/emitter and the collector are exposed.

In the method of manufacturing a bonded semiconductor substrate according to the present invention, a $SiO_2$ layer is formed on the surface of at least one of first and second silicon substrates. The first silicon substrate includes a SiGe mixed crystal layer and a collector layer (N⁻Si/N⁺SiGe/N⁺Si layer) both grown epitaxially. The surfaces of the first and second silicon substrates contact each other, and the substrates are bonded by high-temperature heat treatment. The first silicon substrate is then etched from the back thereof and, in this etching, a SiGe layer is used as an etching stopper.

With the above method, a bonded semiconductor substrate including an element forming layer having a uniform thickness can be achieved.

In the method of manufacturing a dielectric isolated high-speed bipolar transistor according to the present invention, when a bipolar transistor is formed on the bonded semiconductor substrate manufactured by the above method, grooves are formed selectively as a deep trench and a shallow trench in the N⁻Si/N⁺SiGe/N⁺Si layer, and an insulation film is deposited into each of the grooves to form an element isolation region having a double trench structure.

If the bonded semiconductor substrate having the above structure is used, the variations in collector resistance as well as the collector-to-substrate capacitance and the collector-to-base capacitance can be decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2E are cross-sectional views of a modification to the semiconductor structure shown in FIGS. 1A to 1E;

FIGS. 4A to 4F are cross-sectional views of a semiconductor structure in the respective steps of a method of manufacturing a dielectric isolated bipolar transistor according to another embodiment of the present invention.

DETAILED DESCRIPTION OF THE PREFERRED EMBODIMENTS

Embodiments of the present invention will now be described, with reference to the accompanying drawings.

Figures 1A, 1B:
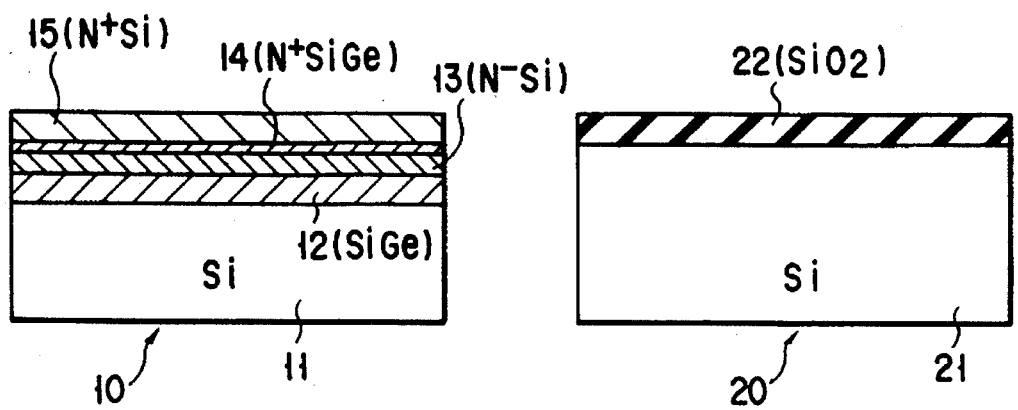
FIGS. 1A to 1E are cross-sectional views of a semiconductor structure in the respective steps of a method of manufacturing a bonded semiconductor substrate according to an embodiment of the present invention.

As shown in FIG. 1A, a SiGe mixed crystal layer 12, a N⁻Si layer 13, a N⁺SiGe mixed crystal layer 14, and a N⁺Si layer 15 are epitaxially grown in this order on the top surface of a silicon substrate 11 to form a first substrate 10. It is advisable that the thicknesses of the layers 12 to 15 are 100 nm, 800 nm, 100 nm and 1000 nm, respectively.

When the SiGe mixed crystal layer 12 is formed, the composition ratio of Ge to Si has to be determined in consideration of the etching selective ratio of Ge to Si and the critical thickness of the epitaxial growth layer, as will be described later.

Figure 5:
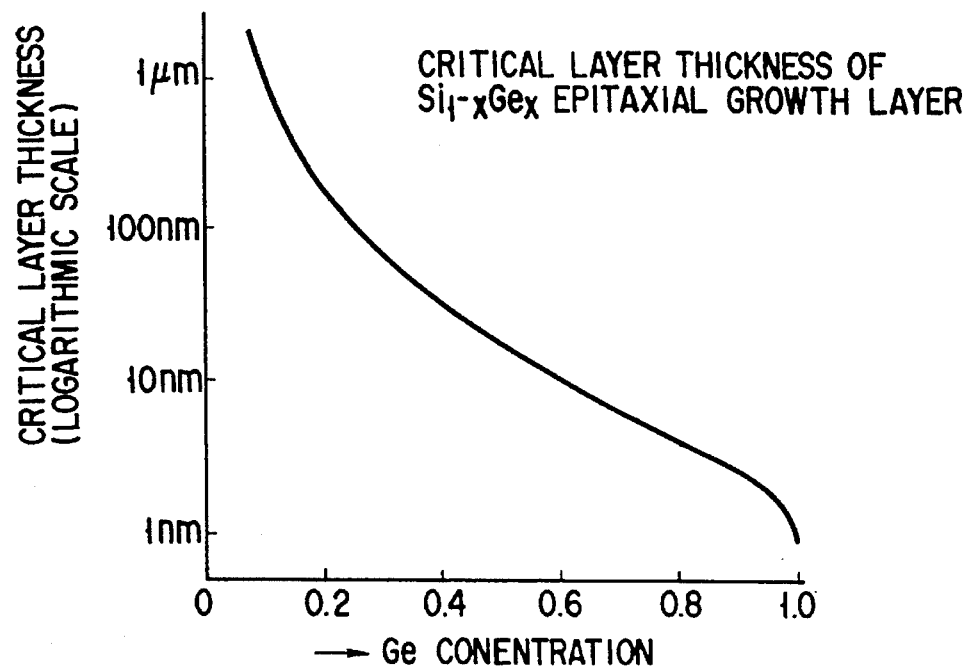
FIG. 5 is a graph showing an example of measured data representing the relationship between the concentration of Ge contained in a SiGe mixed crystal layer formed in the steps shown in FIGS. 1A to 1E and the critical thickness of a $Si_{1-x}Ge_x$ epitaxial growth layer formed in the same steps.

The higher the concentration of Ge, the larger the etching selective ratio of Ge to Si. As shown in FIG. 5, the critical thickness of an epitaxial growth layer (the maximum thickness of the layer capable of being formed in misfit dislocation free) tends to decrease as the concentration of Ge increases. FIG. 5 shows an example of measured data representing the relationship between the concentration of Ge and the critical thickness of a $Si_{1-x}Ge_x$ epitaxial growth layer. This measured data is published in APPLIED PHYSICS LETTER, 1985, Vol. 47, page 322–324.

As is apparent from the graph shown in FIG. 5, for example, as in the embodiment of the present invention, it is necessary to set the percentage of Ge in the SiGe mixed crystal layer 12 at 20% or less in order to form a high-quality epitaxial growth layer when the thickness of the layer 12 is 100 nm, without simply increasing in the composition ratio (percentage) of Ge.

A second substrate 20, which includes a silicon substrate 21 and a $SiO_2$ layer 22 of about 1 to 1.5 μm formed on a top surface of a silicon substrate 21, is prepared, as illustrated in FIG. 1B. The $SiO_2$ layer 22 may be a thermally treated oxide film or a chemically vapor deposited (CVD) oxide film. It is advantageous to use the CVD oxide film rather than the thermal oxide film in order to avoid high-temperature heat treatment.

Figure 1C:
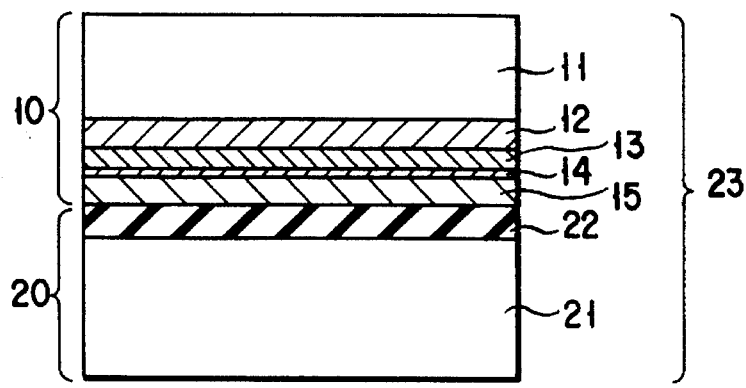

The upper surfaces of the first and second substrates 10 and 20 contact each other, as shown in FIG. 1C, and these substrates are thermally heated for about 30 minutes in a $N_2$ atmosphere of 1000° C. to be bonded to each other, thus completing a bonded wafer 23.

Figure 1D:
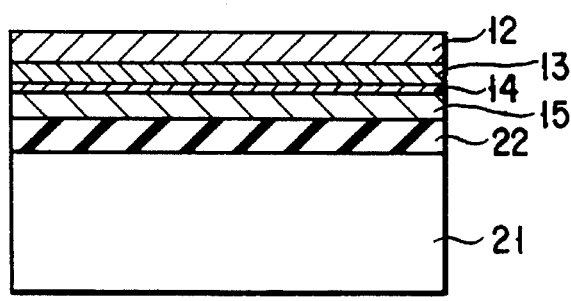

After that, as shown in FIG. 1D, the bonded wafer 23 is polished from the back (opposite to the top surface) of the first substrate 10. The polishing is stopped when it is performed to such an extent that the SiGe mixed crystal layer 12 of the first substrate 10 is not exposed, since variation is large in polishing. Thereafter, the selective etching is executed. The reason for performing the polishing prior to the selective etching is that the substrate 10 is generally quite thin, and thus an extremely long time is required to remove the substrate 10 if the selective etching is used from the beginning.

The above selective etching is executed so that it is stopped at the interface of the silicon substrate 11 and SiGe mixed crystal layer 12, that is, it is stopped at the time when the SiGe mixed crystal layer is exposed, by using an etchant which has a large etching ratio in which the etching speed of Si is significantly higher than of SiGe. A mixed solution of KOH, $K_2Cr_2O_7$, and propanol is suitable for the etchant for selectively etching the silicon substrate 11 on the SiGe mixed crystal layer 12, since the selective ratio of the mixed solution is as large as about 17–20 (disclosed in Appl. Phys. Lett., 56, 373–375, 1990).

Figure 1E:
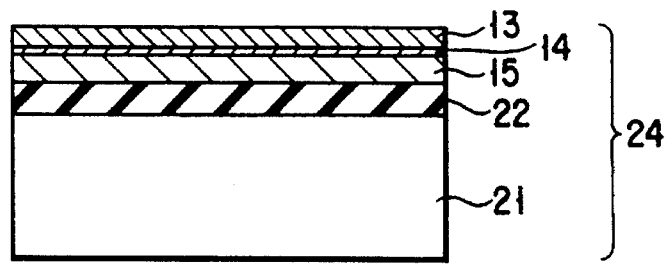

If the exposed SiGe mixed crystal layer 12 is selectively etched to its underlying N—Si layer 13, a bonded semiconductor substrate 24 having the SOI structure is obtained, as shown in FIG. 1E.

It is advisable to use a mixed solution of HF, $H_2O_2$, and $CH_3COOH$ as an etchant for etching the layer 12 (disclosed in J. Electrochem. Soc., 138, 202–204, 1991). The selective ratio in etching speed of the SiGe mixed crystal layer 12 to the N—Si layer 13 depends upon the percentage of Ge and, when the percentage is 20% or more, the selective ratio is 20 or more. The above selective (wet) etching using the etchant can be replaced with dry etching.

The element forming layer having the SOI structure obtained at this stage maintains a uniform thickness which is substantially the same as that of the layer growing epitaxially. If, therefore, the element forming layer is uniformly-grown epitaxially by using, for example, a SINGLE WAFER EPITAXIAL REACTOR or the like, the bonded semiconductor substrate 24 having the SOI structure can be improved in thickness uniformity.

Figures 3A, 3B:
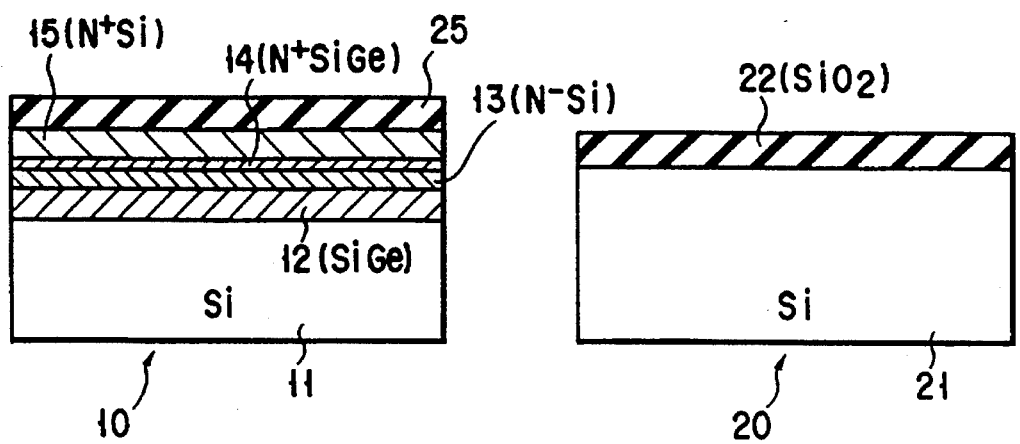
FIGS. 3A to 3E are cross-sectional views of another modification to the semiconductor structure shown in FIGS. 1A to 1E.
Figure 3C:
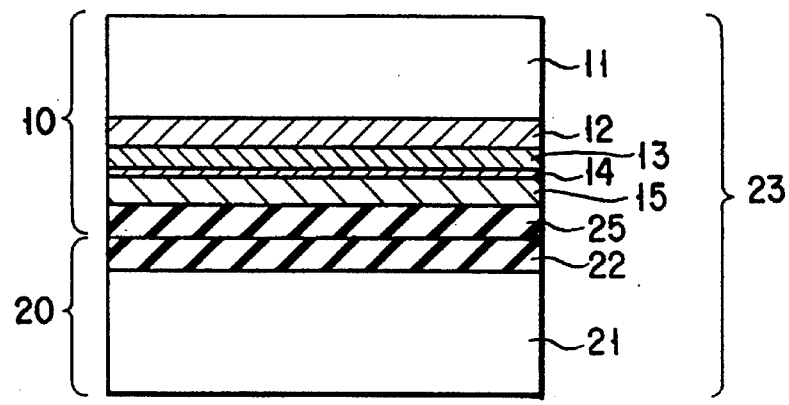
Figure 3D:
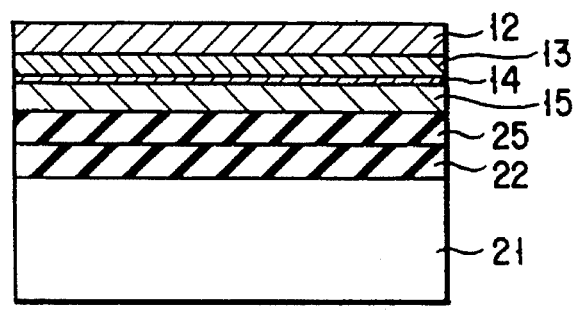
Figure 3E:
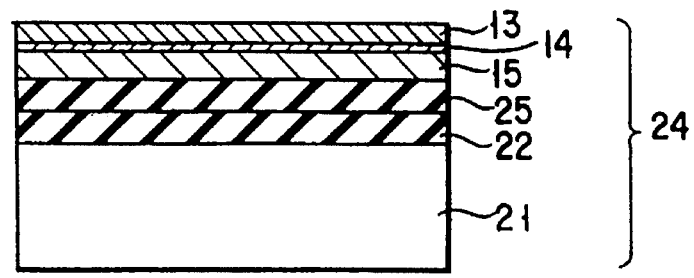

In the foregoing embodiment, the bonded wafer 23 is obtained by bonding the first substrate 10 and the second substrate 20 having the $SiO_2$ layer 22 to each other. The present invention is not limited to this embodiment. FIGS. 2A to 2E and 3A to 3E show first and second modifications to the above embodiment. In the first modification, no $SiO_2$ is formed on the surface of the second substrate 20, as shown in FIG. 2B, while a $SiO_2$ layer 25 is formed on a $N^+Si$ layer 15 of the first substrate 10, as shown in FIG. 2A. As shown in 2C, a bonded wafer 23 can thus be formed by bonding the first and second substrates 10 and 20 to each other. Since the steps of FIGS. 2C to 2E are the same as those of FIGS. 1C to 1E, their descriptions are omitted. In the second modification, a $SiO_2$ layer 25 is formed on a $N^+Si$ layer 15 of the first substrate 10, as shown in FIG. 3A, while a $SiO_2$ layer is formed on the surface of the second substrate 20, as shown in FIG. 3B. As shown in FIG. 3C, a bonded wafer 23 can be formed by bonding both the $SiO_2$ layers of the first and second substrates 10 and 20 to each other. Since the steps of FIGS. 3C to 3E are substantially the same as those of FIGS. 1C to 1E, their descriptions are omitted. In the second modification, however, the bonded wafer warps greatly.

FIGS. 4A to 4F are cross-sectional views of a semiconductor structure in the respective steps of a method of manufacturing a dielectric isolated bipolar transistor according to another embodiment of the present invention.

The following are the steps of forming a bipolar transistor on the bonded semiconductor substrate 24, as shown in FIG. 1E, which is completed according to the manufacturing method described above. First, as illustrated in FIG. 4A, a first insulation film pattern 31 is formed on each of element active layers 13a and 13b of a $N^-Si$ layer 13, which serve as an emitter/base and a collector of the bipolar transistor, respectively. The $N^-Si$ layer 13 is removed by selective etching until a $N^+SiGe$ mixed crystal layer 14 is exposed, using the insulation film patterns 31 as masks, with the result that a shallow trench 32 is formed by the remaining $N^-Si$ layer and the mask thereon.

$SiO_2$, SiN, or the like is suitable for the material of the insulation film patterns 31, and the CVD is a desirable method for forming the patterns 31. Furthermore, it is advisable to use the reactive ion etching (RIE) as a method for etching the $N^-Si$ layer 13, in view of a difference in pattern conversion.

Thereafter, as shown in FIG. 4B, a second insulation film pattern 33 is formed on a region other than the element isolation region, and the $N^+SiGe$ mixed crystal layer 14 and $N^+Si$ 15 are selectively etched using the insulation film pattern 33 as a mask, thereby forming a deep trench 34. In this step, too, it is advisable to use the RIE since anisotropic etching has to be performed.

The second insulation film pattern 33 and first insulation film pattern 31 are removed, as illustrated in FIG. 4C.

After that, as shown in FIG. 4D, a thick insulation film 35 (e.g., $SiO_2$ film) is deposited over the surface structure so that the shallow and deep trenches 32 and 34 are filled with the thick insulation film and further the element active layers 13a and 13b are covered with the thick insulation film.

Figure 4E:
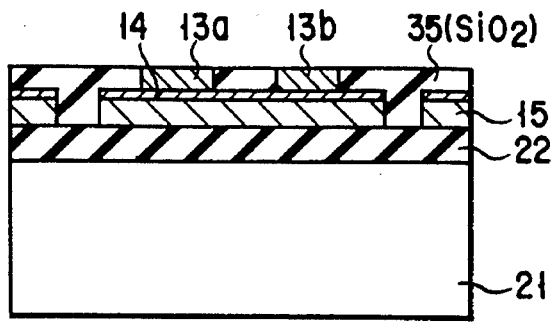

As shown in FIG. 4E, the insulation film 35 is smoothed by the etch-back or polishing until the element active layers 13a and 13b are exposed. An element isolation structure of the dielectric isolated high-speed bipolar having a double trench structure is therefore completed through the above steps.

Figure 4F:
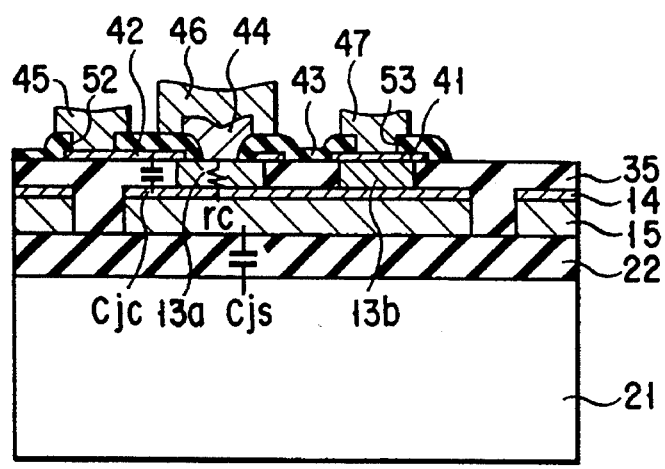

As shown in FIG. 4F, a collector leading electrode 41, a base leading electrode 42, an interlayer insulation film ($CVDSiO_2$ film) 43, an emitter opening 51, and an emitter diffusing polysilicon layer 44 including N-type impurities, are formed by the normal steps. An emitter region (not shown) is then formed in the emitter/base layer 13a by emitter diffusion. After a base opening 52 and a collector opening 53 are formed, a metal wiring layer is formed and patterned, thereby forming a base electrode (wiring) 45, an emitter electrode (wiring) 46, and a collector electrode (wiring) 47. A dielectric isolated high-speed NPN transistor is therefore obtained.

In FIG. 4F, the collector layer 13b, $N^+SiGe$ layer 14, and $N^+Si$ layer 15 constitute a collector region. In FIG. 4F, Cjc indicates a collector-to-base capacitance, Cjs denotes a substrate-to-collector capacitance, and rc represents a collector resistance.

According to the latter embodiment, since the bipolar transistor is formed on the bonded semiconductor substrate 24 of the SOI structure including the element forming layer having a uniform thickness, there occurs only a few variation in the depth of the collector layer ($N^-Si/N^+SiGe/N^+Si$), and the collector resistance and its variations, and the variations in the collector-to-substrate capacitance Cjs and collector-to-base capacitance Cjc can be reduced at the same time. Therefore, a high-speed operation of the bipolar transistor can be achieved.

According to the present invention described above, there can be realized a method of manufacturing a bonded semiconductor substrate including an element forming layer having a uniform thickness, and a method of manufacturing a dielectric isolated high-speed bipolar transistor having a structure capable of reducing the collector-to-substrate capacitance, collector-to-base capacitance, collector resistance, and their variations at the same time, which are hindrances to a high-speed operation of the bipolar-transistor.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a bonded semiconductor substrate, comprising the steps of:

providing a first semiconductor substrate of silicon, having a top surface and a back surface, said top surface having thereon a SiGe mixed crystal layer, a silicon layer containing N-type impurities, a SiGe mixed crystal layer containing N-type impurities which are formed in order by epitaxial growth process;

providing a second semiconductor substrate of a silicon substrate, having a top surface;

providing a silicon oxide film on at least one of said top surface of said first semiconductor substrate and said top surface of said second semiconductor substrate;

contacting said top surfaces of said first and second semiconductor substrates, at least one of which being provided with said silicon oxide film, and bonding said first and second semiconductor substrates to each other by heat treatment;

etching said first semiconductor substrate from said back surface until said SiGe mixed crystal layer is exposed; and etching said SiGe mixed crystal layer until said silicon layer containing N-type impurities is exposed.

2. A method of manufacturing a dielectric isolated bipolar transistor, comprising the steps of:

providing a first semiconductor substrate of silicon; having a top surface and a back surface, said top surface having thereon a first SiGe mixed crystal layer containing N-type impurities, a first silicon layer containing N-type impurities, a second SiGe mixed crystal layer containing N-type impurities, and a second silicon layer containing N-type impurities, which are formed in order by epitaxial growth;

providing a second semiconductor substrate of silicon, having a top surface;

providing a silicon oxide film on at least one of said top surface of said first semiconductor substrate and said top surface of said second semiconductor substrate;

contacting said top surfaces of said first and second semiconductor substrates, at least one of which being provided with said silicon oxide film, and bonding said first and second semiconductor substrates to each other by high-temperature heat treatment;

etching said first semiconductor substrate from said back surface until said first SiGe mixed crystal layer is exposed;

etching said first SiGe mixed crystal layer until said first silicon layer containing N-type impurities is exposed;

providing first insulation films on portions of said first silicon layer containing N-type impurities, said portions serving as a base/emitter and a collector;

etching said first silicon layer containing N-type impurities, using said first insulation films as masks and using said second SiGe mixed crystal layer containing N-type impurities of high concentration as an etching stopper;

providing a second insulation film on a region other than an element isolation region;

etching said second SiGe mixed crystal layer containing N-type impurities and said second silicon layer containing N-type impurities, using said second insulation film as a mask; and removing said first and second insulation films, providing a third insulation film over said first semiconductor substrate, and etching said third insulation film until said portions serving as the base/emitter and the collector are exposed.

3. A manufacturing method according to claim 1, in which said step of forming a silicon oxide film comprises a step of forming the silicon oxide film on said top surface of said first semiconductor substrate.

4. A manufacturing method according to claim 1, in which said step of forming a silicon oxide film comprises a step of forming the silicon oxide film on said top surface of said second semiconductor substrate.

5. A manufacturing method according to claim 1, in which said step of forming a silicon oxide film comprises a step of forming the silicon oxide film on said top surface of said first semiconductor substrate and the silicon oxide film on said top surface of said second semiconductor substrate.

6. A manufacturing method according to claim 1, in which said step of forming a silicon oxide film comprises a step of forming the silicon oxide film by thermal oxidation.

7. A manufacturing method according to claim 1, in which said step of forming a silicon oxide film comprises a step of forming the silicon oxide film by chemical vapor deposition.

8. A manufacturing method according to claim 1, in which said step of etching said first semiconductor substrate from said back surface comprises a first step of etching the first semiconductor substrate from the back surface by polishing to an extent that said SiGe mixed crystal layer is not exposed and a second step of etching the first semiconductor substrate by etching to expose said SiGe layer.

9. A manufacturing method according to claim 8, in which said SiGe mixed crystal layer is used as a stopper in said step of etching said first semiconductor substrate.

10. A manufacturing method according to claim 8, in which said second step of etching said first semiconductor substrate comprises wet etching.

11. A manufacturing method according to claim 8, in which said second step of etching said first semiconductor substrate comprises dry etching.

12. A manufacturing method according to claim 10, in which said wet etching in said second step of etching said first semiconductor substrate is carried out by using a composite solution of $KOH$, $K_2Cr_2O_7$ and Propanol.

13. A manufacturing method according to claim 8, in which said SiGe mixed crystal layer containing N type impurities is used as a stopper in said step of etching said SiGe mixed crystal layer.

14. A manufacturing method according to claim 8, in which said step of etching the SiGe mixed crystal layer is carried out by wet etching.

15. A manufacturing method according to claim 8, in which said step of etching the SiGe mixed crystal layer is carried out by dry etching.

16. A manufacturing method according to claim 10, in which said wet etching of the SiGe mixed crystal layer is carried out by using a composite solution of $HF$, $H_2O_2$ and $COOH$.

17. A manufacturing method according to claim 2, in which said first insulation film comprises an $SiO_2$ film.

18. A manufacturing method according to claim 2, in which said first insulation film comprises an SiN film.

19. A manufacturing method according to claim 17, in which said $SiO_2$ film is formed by chemical vapor deposition.

20. A manufacturing method according to claim 18, in which said SiN film is formed by chemical vapor deposition.

21. A manufacturing method according to claim 2, in which said step of forming said first and second Si layer containing N type impurities is carried out by reactive ion implantation.

22. A manufacturing method according to claim 2, in which said step of forming said first and second SiGe mixed crystal layers containing N type impurities and said first and second Si layer containing N type impurities is carried out by reactive ion implantation.

23. A manufacturing method according to claim 2, in which said step of etching said third insulation film is carried out by etching back.

24. A manufacturing method according to claim 2, in which said step of etching said third insulation film is carried out by polishing.

\* \* \* \* \*